(12) United States Patent
Hurd

(10) Patent No.: US 6,242,915 B1
(45) Date of Patent: Jun. 5, 2001

(54) FIELD-FREQUENCY LOCK SYSTEM FOR MAGNETIC RESONANCE SYSTEM

(75) Inventor: Ralph E. Hurd, Milpitas, CA (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/384,945

(22) Filed: Aug. 27, 1999

(51) Int. Cl.$^7$ .................................................. G01U 3/00

(52) U.S. Cl. ............................................................ 324/309

(58) Field of Search .................................. 324/309, 307, 324/314

(56) References Cited

U.S. PATENT DOCUMENTS 5,998,996 * 12/1999 Bernstein et al. ................ 324/309

* cited by examiner

Primary Examiner—Christine Oda
Assistant Examiner—Dixomara Vargas
(74) Attorney, Agent, or Firm—Quarles & Brady, LLP; Christan G. Cabou

(57) ABSTRACT

A field-frequency lock system for an MRI system includes a microcoil and resonant sample located to sense changes in the polarizing magnetic field. Changes are detected as a shift in frequency of the NMR signal produced by the resonant sample, and the frequency shift is used to compensate the MRI system. Compensation is achieved by adjusting the RF reference signal employed in the MRI system transceiver.

12 Claims, 3 Drawing Sheets

FIELD-FREQUENCY LOCK SYSTEM FOR MAGNETIC RESONANCE SYSTEM

BACKGROUND OF THE INVENTION

The field of the invention is nuclear magnetic resonance (NMR) methods and systems. More particularly, the invention relates to the compensation of NMR systems for variations in the polarizing magnetic field.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. An NMR signal is emitted by the excited spins after the excitation signal $B_1$ is terminated, and this signal may be received and processed.

When utilizing these NMR signals to produce images, magnetic field gradients ($G_x$, $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

It is required that the polarizing field $B_0$ be stable during the series of imaging sequences, which may have a duration of a few seconds to fifteen minutes. The required stability is quite high, and typically changes of from 0.1 to a few parts per million (ppm) can degrade the spectra or image. The stability requirement is thus quite severe, and is especially difficult to achieve in resistive and permanent magnets, as opposed to superconducting magnets.

The instabilities may be caused by external disturbances, (e.g. moving ferrous masses such as elevators), and imperfections in the magnet system. In resistive magnets such imperfections include instabilities in the magnet current and thermal contraction of the coils. In permanent magnets the ambient temperature affects both the dimensions of the magnet and the flux produced by its material and thus this type of magnet is quite sensitive to thermal fluctuations.

The polarizing field stability requirement has been addressed in U.S. Pat. No. 4,623,843 of Macovski, and U.S. Pat. No. 4,417,209 of Hounsfield. They teach how to measure the presence of unwanted fluctuations in the polarizing field $\Delta B_0$ and how to use the measured signal to compensate for $\Delta B_0$. This $\Delta B_0$ measurement is done by NMR, using a separate reference sample located outside the imaged object but inside the $B_0$ field region. The reference sample can be excited separately or by the same RF excitation field as that of the object. The reference signal from the sample produces an NMR signal having a frequency $f_0 + \Delta f_0$, which is proportional to $B_0 + \Delta B_0$. The measured frequency changes $\Delta f_0$ are used for demodulating the acquired NMR signals received from the object, thus compensating for the $\Delta B_0$ instabilities during reception. Methods for compensating the magnitude of the polarizing field $B_0$ during excitation of the object are also described.

Prior systems for compensating $\Delta B_0$ have several basic flaws. The gradients used during the spectroscopic or imaging sequence cause additional magnetic fields at the points where $B_0$ is being measured, and they change very rapidly with time. This fact has made it impossible to use a continuously measuring NMR-probe. The NMR $B_0$ sensors, therefore, have to be used in the pulsed mode, which means that the compensation signal is available only during part of the scan time. This complicates its use because it has to be coordinated with the imaging pulse sequence to provide signal when needed.

Another problem with the magnetic field gradients is that they decrease the obtainable NMR signal from the sensor, because they dephase the NMR signal across its sensitive volume. This results in a shortening of the duration of the nuclear free precession signal obtained for each pulse. This means that the sensitive volume of the sensor cannot be very large. As a consequence the signal-to-noise (S/N) ratio of the NMR sensor is at best only a little better than needed and at worst it can degrade the final image quality.

As disclosed in U.S. Pat. No. 5,488,950, one solution to these problems is to employ electron-spin resonance (ESR) as a means for measuring changes in the polarizing magnetic field. As with NMR, ESR employs a strong polarizing magnetic field to measure resonant signals, but in ESR the resonant signals are produced by electrons rather than nuclei. ESR typically operates at microwave frequencies and employs electronics and coil structures that are substantially different than those employed in NMR.

In recent years small rf coils called "microcoils" have been developed for use in NMR spectroscopy and NMR imaging. As described in U.S. Pat. Nos. 5,684,401 and 5,654,636, microcoils are used in spectroscopy to obtain NMR signals from very small samples. As disclosed in U.S. Pat. No. 5,655,234, microcoils are also used in NMR imaging applications where they are imbedded in medical instruments (e.g. catheters, biopsy needles, etc.) and used to produce signals from which their location in the patient can be determined.

SUMMARY OF THE INVENTION

The present invention is a field-frequency lock system for an NMR system in which a microcoil and resonant sample are positioned in the polarizing magnetic field of the NMR system at a location which is substantially shielded from the gradient magnetic fields produced by the NMR system during a scan. The resonant sample is excited by energizing the microcoil, and the resulting signal produced by the resonant sample is acquired and analyzed to determine its resonant frequency. This resonant frequency measurement is used to determine changes in the polarizing magnetic field of the NMR system and to produce corrective signals. The corrective signals may be used to compensate the polarizing magnetic field strength, or they may be used to modulate the RF reference frequency employed by the NMR system during its scan of a subject.

DESCRIPTION OF THE PREFERRED EMBODIMENT

Figure 1:
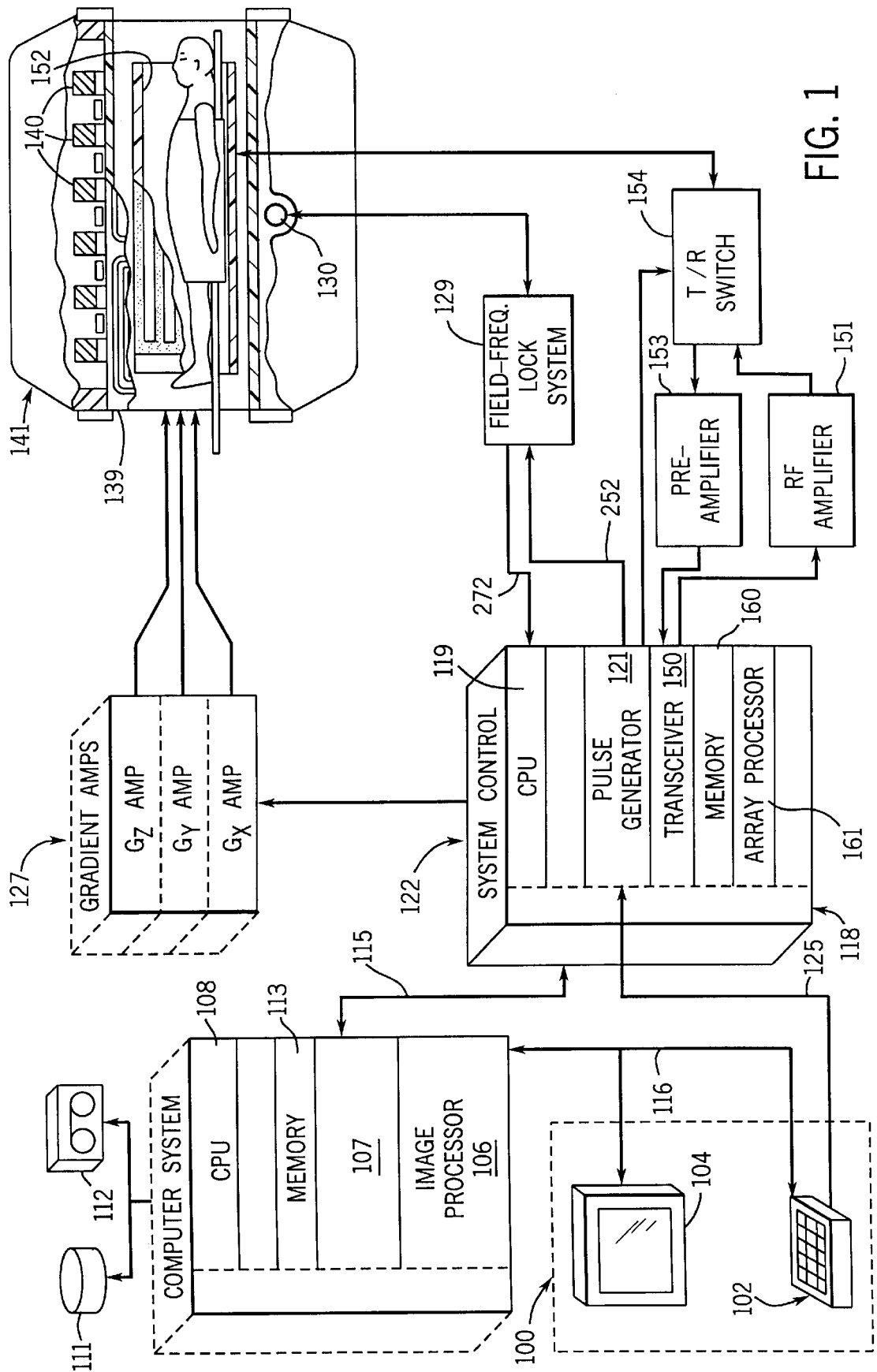
FIG. 1 is a block diagram of an MRI system which employs the present invention.

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding acquired signals.

The gradient coil assembly 139 forms part of a magnet assembly 141 which includes a polarizing magnet 140 and a whole-body RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of spectroscopic or image data. This data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104.

As will be described in greater detail below, the pulse generator module 121 also controls the operation of a field-frequency lock system 129. The lock system 129 operates with a microcoil 130 to measure variations in the polarizing magnetic field strength $B_0$ and produce a corrective signal to the CPU module 119 in the system control 122.

Figure 2:
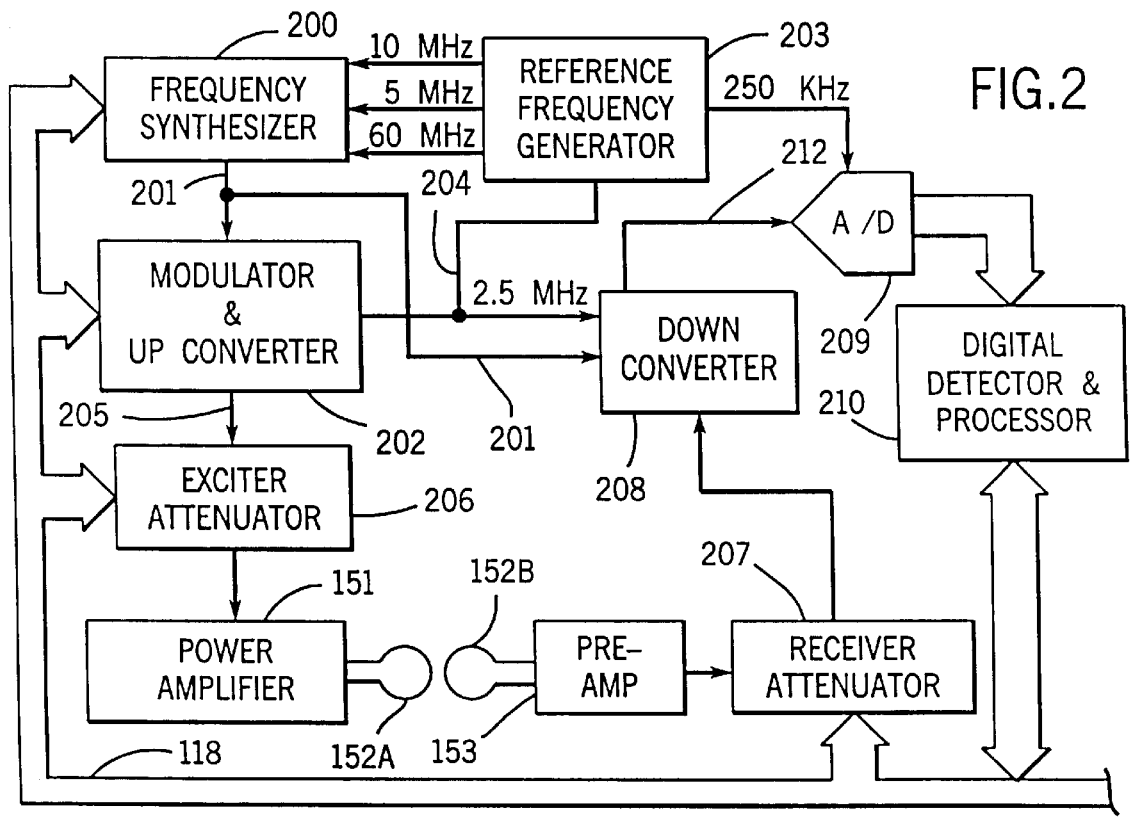
FIG. 2 is an electrical block diagram of the transceiver which forms part of the MRI system of FIG. 1.

Referring particularly to FIGS. 1 and 2, the transceiver 150 produces the RF excitation field B1 through power amplifier 151 at a coil 152A and receives the resulting signal induced in a coil 152B. As indicated above, the coils 152A and B may be separate as shown in FIG. 2, or they may be a single wholebody coil as shown in FIG. 1. The base, or carrier, frequency of the RF excitation field is produced under control of a frequency synthesizer 200 which receives a set of digital signals (CF) from the CPU module 119 and pulse generator module 121. These digital signals indicate the frequency and phase of the RF carrier signal produced at an output 201. As will be described in detail below, the frequency of this RF carrier is changed by the corrective signal produced by the field-frequency lock system 129. The commanded RF carrier is applied to a modulator and up converter 202 where its amplitude is modulated in response to a signal R(t) also received from the pulse generator module 121. The signal R(t) defines the envelope of the RF excitation pulse to be produced and is produced in the module 121 by sequentially reading out a series of stored digital values. These stored digital values may, in turn, be changed from the operator console 100 to enable any desired RF pulse envelope to be produced.

The magnitude of the RF excitation pulse produced at output 205 is attenuated by an exciter attenuator circuit 206 which receives a digital command, TA, from the backplane 118. The attenuated RF excitation pulses are applied to the power amplifier 151 that drives the RF coil 152A. For a more detailed description of this portion of the transceiver 122, reference is made to U.S. Pat. No. 4,952,877 which is incorporated herein by reference.

Referring still to FIGS. 1 and 2 the signal produced by the subject is picked up by the receiver coil 152B and applied through the preamplifier 153 to the input of a receiver attenuator 207. The receiver attenuator 207 further amplifies the signal by an amount determined by a digital attenuation signal (RA) received from the backplane 118.

The received signal is at or around the Larmor frequency, and this high frequency signal is down converted in a two step process by a down converter 208 which first mixes the NMR signal with the carrier signal on line 201 and then mixes the resulting difference signal with the 205 Mhz reference signal on line 204. The down converted NMR signal is applied to the input of an analog-to-digital (A/D) converter 209 which samples and digitizes the analog signal and applies it to a digital detector and signal processor 210 which produces 16-bit in-phase (I) values and 16-bit quadrature (Q) values corresponding to the received signal. The resulting stream of digitized I and Q values of the received signal are output through backplane 118 to the memory module 160 where they are employed to reconstruct an image.

The 2.5 Mhz reference signal as well as the 250 kHz sampling signal and the 5, 10 and 60 Mhz reference signals are produced by a reference frequency generator 203 from a common 20 Mhz master clock signal. For a more detailed description of the receiver, reference is made to U.S. Pat. No. 4,992,736 which is incorporated herein by reference.

Figure 3:
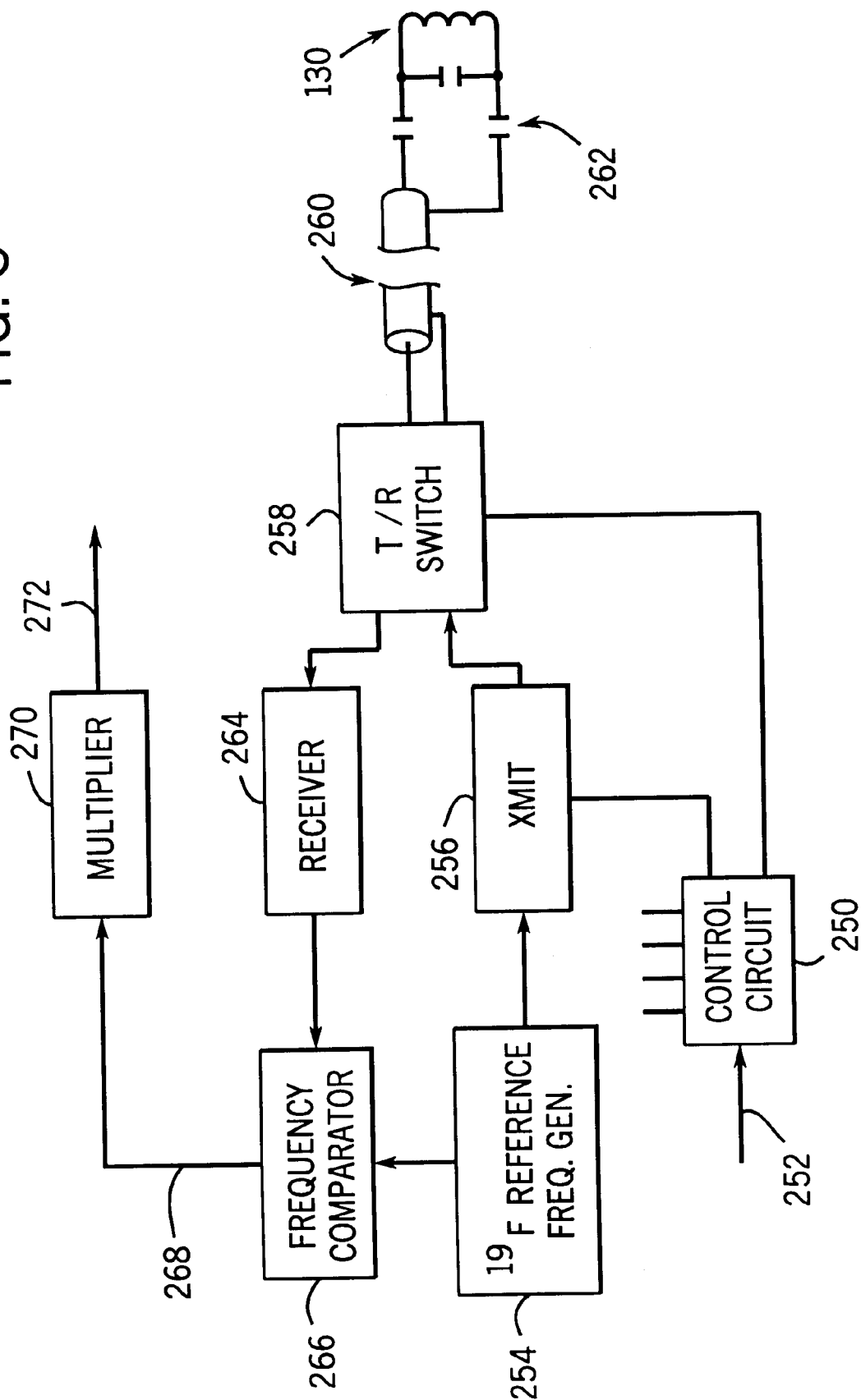
FIG. 3 is an electrical block diagram of the field-frequency lock system which forms part of the MRI system of FIG. 1.

Referring particularly to FIG. 3, the field-frequency lock system includes a control circuit 250 which operates the lock system in response to gating signals received at 252 from the pulse generator module 121. The lock system 129 includes a frequency generator 254 that produces a reference frequency at the resonant frequency of the sample encircled by the microcoil 130. In the preferred embodiment the resonant sample contains $^{19}$F which has a gyromagnetic ratio $\gamma=2.5181\times10^8$. The reference frequency is determined using a "nominal" polarizing field strength $B_n$ of the MRI system as follows:

$$\omega_r=\gamma B_n.$$

The reference frequency is applied to a transmitter 256, which produces a broad band rf excitation pulse centered on the reference frequency. The rf pulse has a flip angle of 90° and is conveyed through a transmit/receive switch 258 and coupled to the microcoil 130 through a coaxial cable 260 and impedance matching circuit 262.

The resulting rf field produced by the microcoil 130 produces transverse magnetization in the $^{19}$F spins contained in the resonant sample, and a free induction decay (FID) NMR signal is produced and received by the microcoil 130. The transmit/receive switch 258 is switched to the receive mode, and the NMR signal is coupled to and amplified by a receiver 264. The frequency of this received signal is determined by the actual polarizing field strength ($B_A$):

$$\omega_A=\gamma B_A.$$

Both the reference frequency $\omega_r$ and the frequency $\omega_A$ of the received NMR signal are applied to a frequency comparator 266. The resulting difference frequency $\Delta\omega$ at output 268 is indicative of the change ($\Delta B$) in the polarizing magnetic field from its nominal value $B_n$:

$$\Delta\omega=\omega_r-\omega_A=\gamma B_n-\gamma B_A$$

$$\Delta B=\Delta\omega/\gamma.$$

This change in polarizing magnetic field $\Delta B$ may be calculated and used to drive a trim coil (not shown) which directly compensates the polarizing magnetic field $B_0$ such that it equals the nominal value $B_n$. As will now be described however, in the preferred embodiment the compensation is accomplished by adjusting the reference frequency 201 produced by the frequency synthesizer 200 in the transceiver (FIG. 2).

Because the resonant frequency of the $^{19}$F spins is different than the resonant frequency of $^1$H spins being imaged by the MRI system of FIG. 1, the difference frequency $\Delta\omega$ cannot be used directly. Instead, the frequency difference signal $\Delta\omega$ is applied to a multiplier 270 which multiplies it by a factor determined by the ratio of the respective gyromagnetic constants of $^1$H and $^{19}$F:

$$\text{Factor}=\gamma_H/\gamma_F=2.67519\times10^8/2.5181\times10^8$$

$$\text{Factor}=1.06238.$$

The resulting frequency compensation value is output by the multiplier at 272 to the CPU module 119 in the system control 112 (FIG. 1). The CPU module 119 in turn alters the frequency command (CF) by a corresponding amount to adjust the transceiver reference frequency as explained above with reference to FIG. 2.

Figure 4:
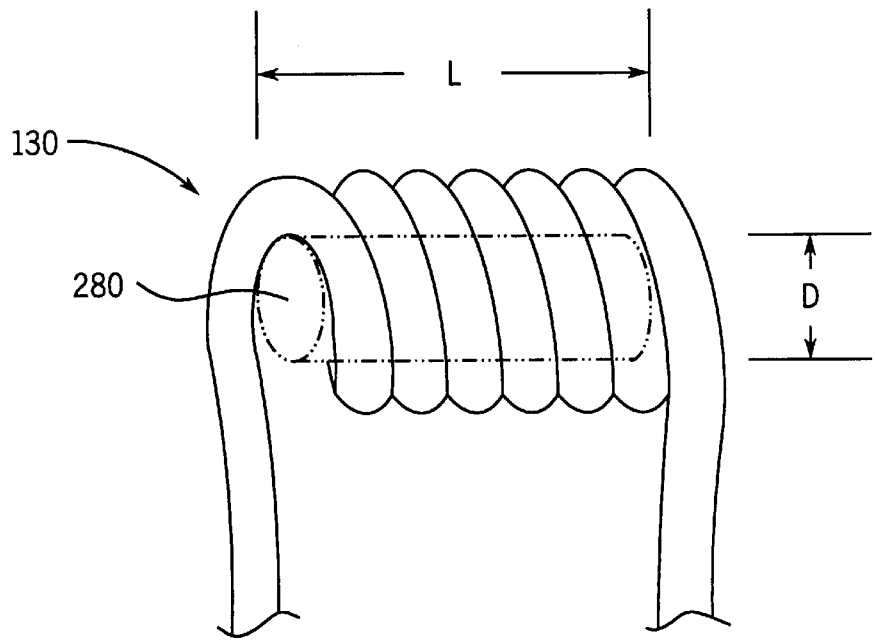
FIG. 4 is a schematic diagram of a preferred microcoil used with the system of FIG. 3.

Referring particularly to FIG. 4, the microcoil assembly includes the microcoil 130 and a sample holder 280. The size of the microcoil 130 and the sample holder 280 are minimized to reduce the change in magnetic field strength across their length (L) and diameter (D) due to magnetic field gradients. On the other hand, the resonant sample must be large enough in size to produce an NMR signal having a reasonable SNR. The exact size is determined by the particular MRI system used and the ability to locate the microcoil 130 in a location where the gradient magnetic fields are substantially suppressed. In the preferred embodiment shown in FIG. 1, the microcoil 130 is located near the system isocenter, but outside the gradient coil assembly 139. An active gradient shield as described in U.S. Pat. Nos. 5,378,989 and 5,296,810 is employed on the MRI system to minimize the gradient fields produced outside the diameter of the gradient coil assembly 139. The microcoil 130 is thus positioned in the polarizing magnetic field $B_0$, but at a location where the gradient fields are substantially suppressed.

The scope of the sample holder 280 and surrounding microcoil 130 are also determined by the residual gradient fields. If the respective gradient fields $G_x$, $G_y$ and $G_z$ seen by the microcoil 130 are substantially the same, the dimensions D and L should also be substantially the same. However, one of the gradient fields may be substantially less than the others, and in this case, the dimension L may be larger than D. In such case, the long axis of the microcoil 130 and sample holder 280 are aligned along the weaker gradient field axis.

To avoid potential rf interference problems, the resonant sample used by the field-frequency lock system employs non-proton nuclei. In the preferred embodiment fluorine ($^{19}$F) is used because of its relatively high gyromagnetic ratio ($\gamma$). A number of compounds may be used including: perfluo-t-butyl alcohol $[(CF_3)_3COH]$ and carbon tetrafluoride, freon 14. Both have high concentrations of $^{19}$F spins in liquid form, and they have only a single chemical shift. Because of temperature sensitivity, it may be necessary to regulate the temperature of the microcoil assembly or temperature compensate the correction signals that are produced.

What is claimed is:

1. In an MRI system having a magnet for producing a polarizing magnetic field $B_0$ in a region, and a gradient coil assembly for producing magnetic field gradients in a subject to be imaged located in the region, a field-frequency lock system which comprises:

a microcoil located outside the gradient coil assembly and in the region in which the polarizing magnetic field $B_0$ is produced;

a resonant sample disposed adjacent the microcoil and containing a material that produces a signal when the microcoil is energized with an rf pulse;

transmit means for producing an rf pulse that is applied to the microcoil;

receive means for acquiring a signal from the microcoil that is produced by the resonant sample material;

a frequency comparator for measuring the difference frequency ($\Delta\omega$) between the frequency of the acquired signal and a reference frequency which corresponds to a frequency produced by the resonant sample material when the polarizing magnetic field $B_0$ is at a nominal value; and means responsive to the difference frequency $\Delta\omega$ for compensating the operation of the MRI system as it performs a scan on the subject for variations in the magnitude of the polarizing magnetic field $B_0$.

2. The system as recited in claim 1 in which the MRI system includes a transceiver which produces rf excitation pulses and acquires NMR signals during the scan of the subject, and the means for compensating the operation of the MRI system adjusts the frequency of a reference signal employed by the transceiver.

3. The system as recited in claim 1 in which the resonant sample contains fluoride spins ($^{19}$F).

4. The system as recited in claim 2 in which the microcoil is wound around the resonant sample.

5. The system as recited in claim 1 in which the resonant sample material produces a nuclear magnetic resonance signal.

6. The system as recited in claim 1 in which the gradient coil assembly is actively shielded and the microcoil is located outside the active shield.

7. A method for compensating an MRI system for changes in the polarizing magnetic field of the MRI system, the steps comprising:

monitoring a microcoil positioned in the polarizing magnetic field at a location in which magnetic field gradients are minimal;

acquiring an NMR signal from a resonant sample disposed adjacent the microcoil;

producing a difference signal by comparing the frequency of the acquired NMR signal with the frequency of a reference signal that is indicative of the NMR signal produced by the resonant sample when the polarizing magnetic field has a nominal value; and producing a compensating signal for the MRI system from the difference signal which offsets changes in the polarizing magnetic field.

8. The method as recited in claim 7 in which the resonant sample produces an NMR signal having a substantially different frequency than the NMR signals produced by a subject being scanned with the MRI system.

9. The system as recited in claim 8 in which the resonant sample includes fluorine spins ($^{19}$F) and the method includes controlling the temperature of the resonant sample to maintain it at a constant temperature.

10. The system as recited in claim 7 which includes:

adjusting the frequency of a reference signal in the MRI system with the compensating signal.

11. The system as recited in claim 10 in which the adjusted reference signal is employed during a scan to demodulate NMR signals produced when performing a scan.

12. The system as recited in claim 10 in which the adjusted reference signal is employed to produce rf excitation pulses when performing a scan.

* * * * *